(12) United States Patent
Bauer et al.

(10) Patent No.: US 8,497,687 B2
(45) Date of Patent: Jul. 30, 2013

(54) METHOD AND APPARATUS FOR MONITORING ELECTRICAL GROUND ISOLATION IN A POWERTRAIN SYSTEM

(75) Inventors: Harry J. Bauer, Troy, MI (US); Wei D. Wang, Troy, MI (US); James E. Tarchinski, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 378 days.

(21) Appl. No.: 12/690,986

(22) Filed: Jan. 21, 2010

(65) Prior Publication Data

US 2011/0175619 A1    Jul. 21, 2011

(51) Int. Cl.
*G01R 31/14* (2006.01)

(52) U.S. Cl.
USPC ............................ 324/510; 324/509; 363/55

(58) Field of Classification Search
USPC ................... 324/509, 510; 363/95, 98, 56.02, 363/132; 361/23, 42, 44
See application file for complete search history.

(56) References Cited

U.S. PATENT DOCUMENTS

| | | | |
|---|---|---|---|
| 6,381,110 B1 * | 4/2002 | Nagashima et al. | 361/23 |
| 6,611,441 B2 | 8/2003 | Kurokami et al. | |
| 7,145,268 B2 * | 12/2006 | Edwards et al. | 307/127 |
| 7,154,277 B2 | 12/2006 | Vallinmaki et al. | |
| 7,292,042 B2 * | 11/2007 | Morita et al. | 324/509 |

\* cited by examiner

*Primary Examiner* — Arleen M Vazquez
*Assistant Examiner* — Feba Pothen

(57) ABSTRACT

A method for monitoring operation of a vehicle including a high voltage electrical system including an electrical energy storage device electrically connected to switching circuits of an inverter device via a high voltage bus, the inverter device configured to transfer electric power to an electric machine via activation of a plurality of switch devices, includes monitoring electrical ground isolation of the high voltage electrical system during ongoing operation of the vehicle, detecting an electrical ground isolation fault in the high voltage electrical system, and detecting a location of the electrical ground isolation fault associated with at least one of the electrical energy storage device, the high voltage bus, the inverter device, and the electric machine subsequent to a vehicle key-off event.

5 Claims, 3 Drawing Sheets

METHOD AND APPARATUS FOR MONITORING ELECTRICAL GROUND ISOLATION IN A POWERTRAIN SYSTEM

TECHNICAL FIELD

This disclosure pertains to electrical systems for powertrain systems, including hybrid powertrain systems.

BACKGROUND

The statements in this section merely provide background information related to the present disclosure and may not constitute prior art.

Vehicles use powertrain systems to generate tractive torque, including hybrid powertrain architectures that transfer torque through a transmission to an output member. Known hybrid powertrain architectures include internal combustion engines and torque machines that transfer torque through a transmission device to an output member. The output member can be coupled to a driveline for a motor vehicle for transferring tractive torque thereto. The torque machines can include electric machines that are configured to operate as torque motors and electric power generators.

Known hybrid powertrain architectures include direct current (DC) high-voltage electrical energy storage systems that transfer electrical power via a high voltage bus to on-board and extra-vehicle electrical devices. On-board electrical devices include auxiliary power modules to transfer power to a low-voltage battery, accessory motors for powering accessory devices, e.g., an air conditioning compressor, and inverter devices to power electric motors, including torque machines.

A fault in the high voltage bus and the on-board electrical devices may result in a loss of electrical isolation. A loss in electrical isolation requires service to correct. Identifying a particular location for a fault causing a loss in electrical isolation facilitates service procedures to identify a repair procedure, reduces service costs, and reduces vehicle downtime.

SUMMARY

A method for monitoring operation of a vehicle including a high voltage electrical system including an electrical energy storage device electrically connected to switching circuits of an inverter device via a high voltage bus, the inverter device configured to transfer electric power to an electric machine via activation of a plurality of switch devices, includes monitoring electrical ground isolation of the high voltage electrical system during ongoing operation of the vehicle, detecting an electrical ground isolation fault in the high voltage electrical system, and detecting a location of the electrical ground isolation fault associated with at least one of the electrical energy storage device, the high voltage bus, the inverter device, and the electric machine subsequent to a vehicle key-off event.

BRIEF DESCRIPTION OF THE DRAWINGS

One or more embodiments will now be described, by way of example, with reference to the accompanying drawings, in which.

DETAILED DESCRIPTION

Figure 1:
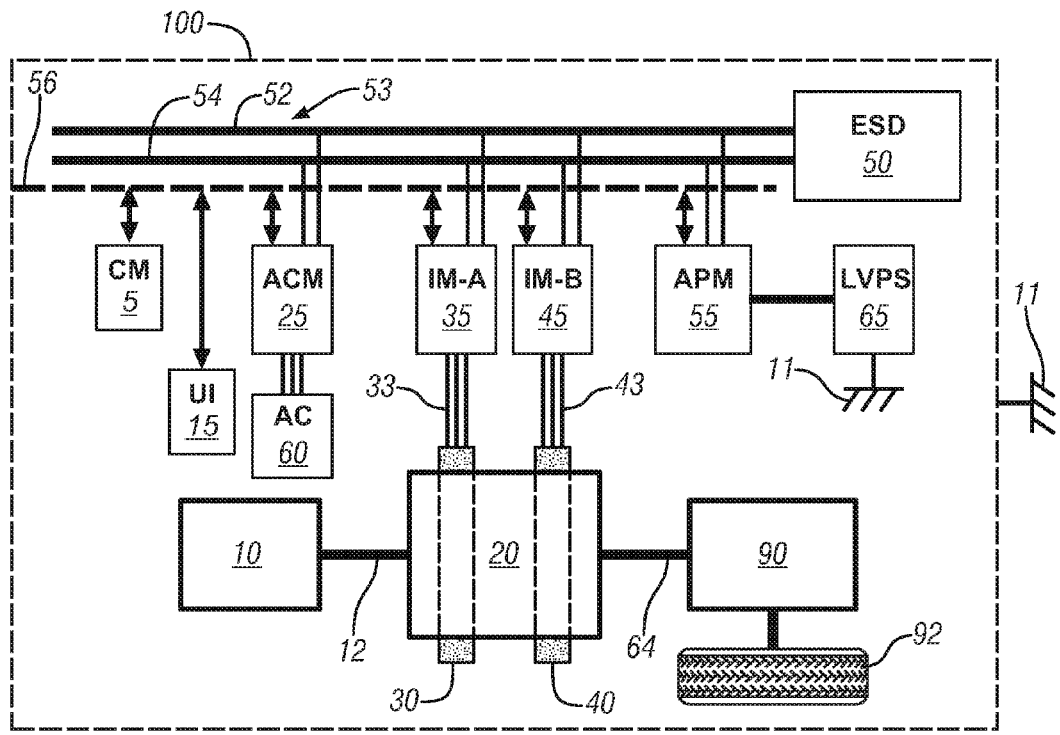
FIG. 1 is a schematic diagram of a vehicle including a hybrid powertrain in accordance with the present disclosure.

Referring now to the drawings, wherein the showings are for the purpose of illustrating certain exemplary embodiments only and not for the purpose of limiting the same, FIG. 1 shows an embodiment of a vehicle 100 including a hybrid powertrain system configured in accordance with the concepts described herein. The exemplary hybrid powertrain system includes an internal combustion engine 10 mechanically coupled via an input member 12 to a hybrid transmission 20. The hybrid transmission 20 is configured to transfer torque between the input member 12, first and second torque machines 30 and 40, and an output member 64 coupled to a driveline 90 including one or more tractive wheels 92 in response to an operator torque request and other power demands of the hybrid powertrain system. The hybrid transmission 20 selectively operates in one of a plurality of fixed gear, neutral, and continuously variable range states to transfer torque between the input member 12 and the output member 64. This embodiment of the vehicle 100 with the hybrid powertrain system is illustrative. The concepts described herein are applicable to powertrain systems employing high voltage electrical systems that are electrically isolated from a vehicle electrical ground.

The hybrid powertrain system includes a high voltage electrical system to transfer high voltage electric power between an on-board electrical energy storage device (ESD) 50 and on-board power modules including power inverter modules, auxiliary power modules, and accessory modules. The high voltage electrical system includes a high voltage DC bus 53 including a positive rail 52 and a negative rail 54 that connects to the ESD 50. The high voltage DC bus 53 transfers electrical power between the ESD 50 and one or more power modules, including the power inverter modules for powering electric machines, the auxiliary power module for power exchange with low-voltage operating devices and systems, and the accessory module for powering on-vehicle accessory devices. The ESD 50 and the high voltage DC bus 53 are electrically isolated from a vehicle chassis electrical ground 11. In the embodiment shown, the high voltage DC bus 53 transfers electrical power between the ESD 50 and first and second inverter modules (IM-A, IM-B) 35 and 45, an auxiliary power module (APM) 55 and an accessory control module (ACM) 25.

The first and second inverter modules (IM-A, IM-B) 35 and 45 transform potential electrical energy stored in the ESD 50 to electrical power that is transferred via electric cables 33 and 43 respectively to the first and second torque machines 30 and 40 respectively. The transformed potential electrical energy is used by the first and second torque machines 30 and 40 to generate mechanical torque. The first and second inverter modules 35 and 45 transform mechanical torque transferred through one or both the first and second torque machines 30 and 40 to storable potential energy for storage in the ESD 50. The mechanical torque that is transformed can originate from the engine 10. Alternatively and in addition, the mechanical torque can originate as regenerative braking torque that is reacted through the driveline 90 to one or more tractive wheels 92 of the vehicle 100.

The auxiliary power module (APM) 55 connects to a low-voltage power supply (LVPS) 65 to transfer low-voltage electrical power therebetween. The low-voltage power supply (LVPS) 65 includes a 12 Vdc battery in one embodiment. The auxiliary power module (APM) 55 includes electric power and control circuitry to convert between high voltage and low-voltage electric power. The accessory control module (ACM) 25 is operative to power an accessory multiphase electric machine (AC) 60, including a multiphase electric machine mechanically coupled to an air conditioning compressor in one embodiment.

A local area network (LAN) bus 56 signally connects to a control module (CM) 5, a user interface (UI) 15, the first and second inverter modules (IM-A, IM-B) 35 and 45, the auxiliary power module (APM) 55, and the accessory control module (ACM) 25 in one embodiment. The local area network (LAN) bus 56 facilitates structured communication of states of operating parameters and actuator command signals between the connected control modules, including the aforementioned control modules. The specific communication protocol utilized is application-specific. The LAN bus 56 and appropriate protocols provide for robust messaging and multi-control module interfacing. Multiple communications buses may be used to improve communications speed and provide some level of signal redundancy and integrity.

A vehicle operator commands operation of the vehicle and the powertrain system using a plurality of interface devices, depicted herein as the user interface (UI) 15. Preferred interface devices include an operator key, an accelerator pedal, a brake pedal, a transmission gear selector (e.g., PRNDL) and a steering wheel. The operator executes a key-on event to operate the vehicle and powertrain system and executes a key-off event to discontinue operating the vehicle and powertrain system using the operator key. The operator commands an operator torque request including vehicle acceleration and braking using the accelerator and brake pedals. The operator commands direction of vehicle travel using the steering wheel. The interface devices are illustrative and not limiting.

Figure 2:
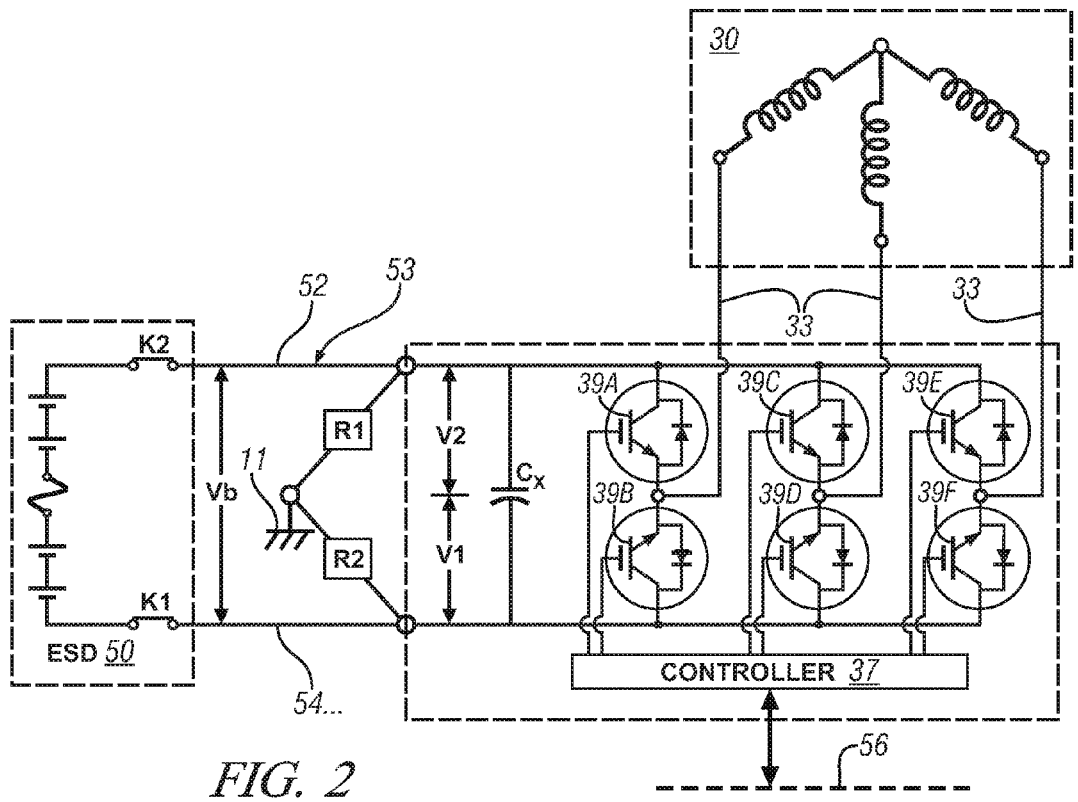
FIG. 2 is a schematic diagram of an electric circuit for a hybrid powertrain in accordance with the present disclosure.

The control module 5 is preferably a general-purpose digital computer that executes a plurality of control schemes in the form of algorithmic code and calibrations to control operation of the vehicle 100. The control schemes include controlling operation of the power modules including power inverter modules for powering electric machines, auxiliary power modules for power exchange with low-voltage operating devices and systems, and accessory modules for powering on-vehicle accessory devices. In the illustrated embodiment, the power inverter modules include the first and second inverter modules (IM-A, IM-B) 35 and 45, the auxiliary power modules for power exchange with low-voltage operating devices and systems include an auxiliary power module (APM) 55, and the accessory modules for powering on-vehicle accessory devices include the accessory control module (ACM) 25 for powering the accessory device (AC) 60 including the air conditioning compressor in the depicted embodiment. The control module 5 provides functions, including monitoring inputs from sensing devices and executing control and diagnostic routines to control operation of actuators using preset calibrations. The control module 5 is shown as an individual discrete device for ease of description. It should be recognized that the functions performed thereby may be executed in a plurality of control module devices that individually control elements of the powertrain system including, e.g., a control module for the engine 10, a control module for the transmission 20, control module(s) for the first and second inverter modules 35 and 45 of the torque machines 30 and 40, and a control module for the accessory multiphase electric machine (AC) 60. A controller 37 including a control module for the first inverter module 35 is shown in FIG. 2. As used herein, the terms control, controller, module, control module and the like are understood to mean various ones or combinations of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs, combinational logic circuit(s), input/output circuit(s) and devices, appropriate signal conditioning and buffer circuitry, and other suitable components to provide the described functionality. The control module has a set of control algorithms, including resident software program instructions and calibrations stored in memory and executed to provide the desired functions. The algorithms are preferably executed during preset loop cycles. Algorithms are executed, such as by a central processing unit, and are operable to monitor inputs from sensing devices and other networked control modules, and execute control and diagnostic routines to control operation of actuators. Loop cycles may be executed at regular intervals, for example each 3.125, 6.25, 12.5, 25 and 100 milliseconds during ongoing engine and vehicle operation. Alternatively, algorithms may be executed in response to occurrence of an event.

FIG. 2 schematically shows details of a portion of the high voltage electrical system including the ESD 50 electrically connected via the positive rail 52 and the negative rail 54 of the high voltage bus 53 to the first inverter module 35 that connects via electric cables 33 to the first torque machine 30. The ESD 50 electrically connects to the positive rail 52 via a high voltage switch K2 and electrically connects to the negative rail 54 via a high voltage switch K1. The first inverter module 35 includes the controller 37 connected to each of a plurality of power transistors 39A-39F to control operation thereof. Exemplary power transistors 39A-39F include insulated gate bipolar transistors (IGBTs) in one embodiment. The power transistors 39A-39F are controllable to one of an OPEN state and a SHORT state. When one of the power transistors 39A-39F is in the OPEN state, there is no electric current flow between an emitter and a collector thereof, i.e., there is an open circuit between the emitter and the collector. When one of the power transistors 39A-39F is in the SHORT state, electric current flows between the emitter and the collector, i.e., there is an short circuit between the emitter and the collector. The controller 37 periodically and repetitively sequentially activates the power transistors 39A-39F to transfer electric power between one of the positive rail 52 and the negative rail 54 of the high voltage bus 53 and one of a plurality of windings of the first torque machine 30 to transform electric power to mechanical torque and to transform mechanical torque to electric power. The chassis ground 11 is shown. The controller 37 measures a first voltage V1 including an electric potential between the chassis ground 11 and the negative rail 54 across a first high-impedance resistor R2 at a specific location in the inverter module 35. The controller 37 measures a second voltage V2 including an electric potential between the positive rail 52 and the chassis ground 11 across a second high-impedance resistor R1 at a specific location in the inverter module 35. The controller 37 measures battery voltage Vb including an electric potential between the positive rail 52 and the negative rail 54 of the high voltage bus 53 at a specific location, preferably in the inverter module 35.

Figure 3:
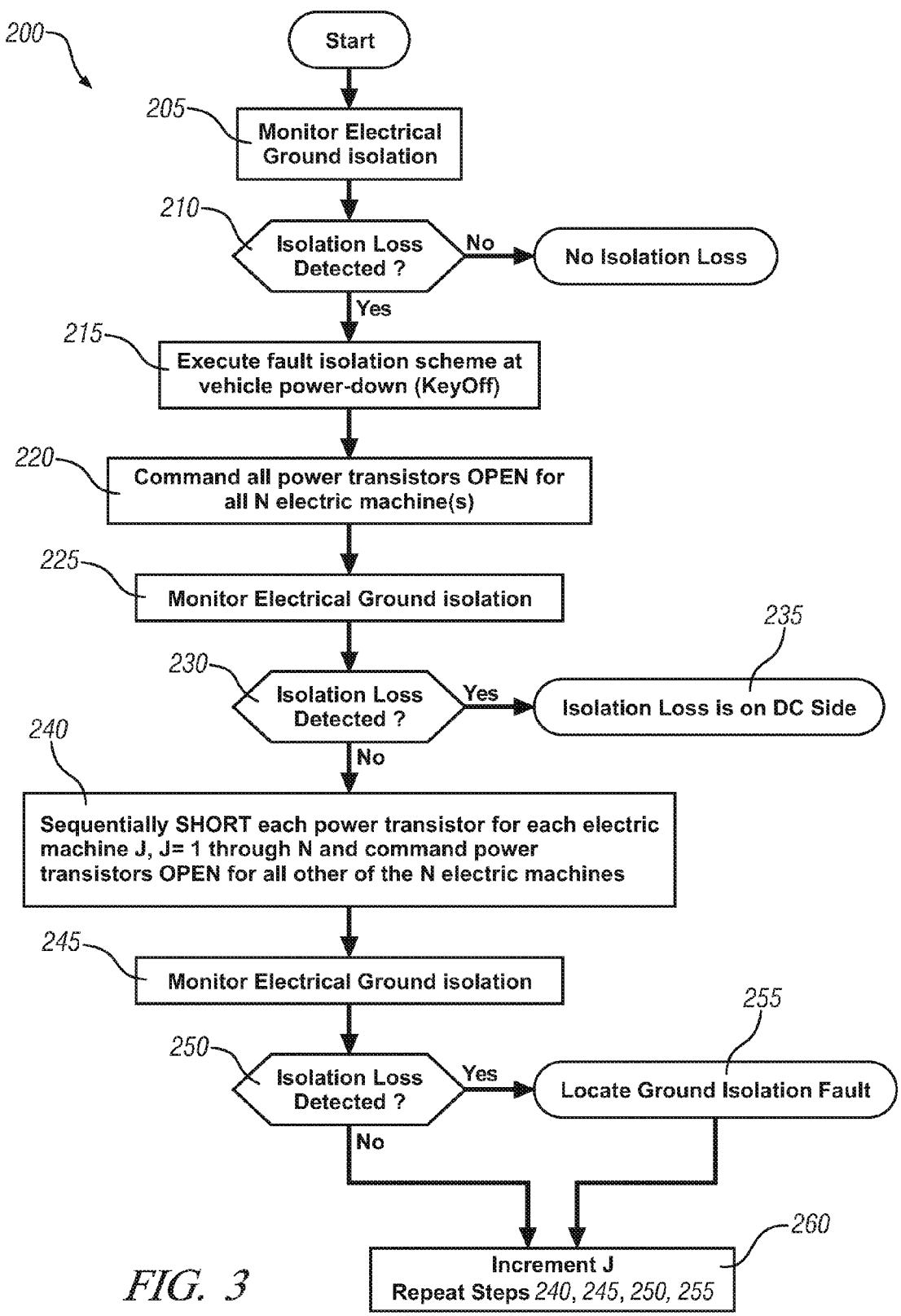
FIG. 3 is a logical flowchart in accordance with the present disclosure.

FIG. 3 shows a logical flowchart 200 for monitoring electrical isolation of an exemplary high voltage electrical system, described with reference to the high voltage electrical system of FIGS. 1 and 2. The flowchart 200 is executed as one or more algorithms in the control module 5 to monitor electrical isolation of the high voltage electrical system, and includes monitoring, detecting, and locating a ground isolation fault. Detecting and locating a ground isolation fault in the high voltage electrical system includes executing a fault isolation scheme subsequent to a vehicle key-off event to detect a presence of the ground isolation fault in the high voltage DC bus 53 and the inverter module(s) for all N electric machine(s), wherein N represents the total number of electric machine(s) used in the hybrid powertrain system. In the embodiment shown in FIG. 1, N=3, including the first and second torque machines 30 and 40 and the accessory multiphase electric machine (AC) 60 and corresponding first and second inverter modules 35 and 45 and accessory control module (ACM) 25.

During ongoing vehicle operation, the control system regularly and periodically monitors electrical ground isolation of the high voltage electrical system (205) to detect loss of isolation leading to a ground isolation fault (210). At a key-off event subsequent to detecting a ground isolation fault, the high voltage electrical system is powered down and the control module 5 executes the fault isolation scheme (215), which includes sending a signal to the controller(s) of the inverter module(s), e.g., controller 37 of inverter module 35, simultaneously commanding all of the power transistors 39A-39F of all N inverter module(s) for all N electric machine(s) to the OPEN state (220). Electrical ground isolation is monitored (225). When a loss of isolation leading to a ground isolation fault is detected (230), the fault isolation scheme indicates that there is a ground isolation fault located on the DC side of the high voltage electrical system, i.e., the ground isolation fault is located in one of the ESD 50 and the high voltage DC bus 53 (235).

The control system sequentially individually commands each of the power transistors 39A-39F for each of the inverter modules for the N electric machine(s) to a SHORT state (240). This operation can be executed even when no loss of isolation leading to a ground isolation fault is detected (230). Alternatively, the control system can sequentially individually command each of the power transistors 39A-39F for each of the inverter modules for the N electric machine(s) to a SHORT state to monitor the entire high voltage electrical system for ground isolation faults after detecting loss of isolation leading to a ground isolation fault is located in the ESD 50 or the high voltage DC bus 53.

The control system sequentially individually commands each of the power transistors 39A-39F for each of the inverter modules for the N electric machine(s) to the SHORT state while commanding the power transistors for all the other inverter modules for the N electric machines to the OPEN state (240) and monitoring electric ground isolation (245) to detect loss of isolation leading to a ground isolation fault (250) associated with the individually commanded one of the power transistors 39A-39F for each of the inverter modules for the N electric machine(s).

In the embodiment shown with reference to FIGS. 1 and 2, the control system sequentially individually commands each of the power transistors 39A-39F for each of the inverter modules for the N electric machine(s) to the SHORT state by commanding power transistor 39A for the first torque machine 30 to the SHORT state while commanding the power transistors 39B-39F for the first inverter module 35 of the first torque machine 30 and all the power transistors for the second inverter module 45 the second torque machine 40 and all the power transistors for the accessory control module (ACM) 25 for the accessory multiphase electric machine (AC) 60 to the OPEN state. The control system monitors electric ground isolation (245) to detect loss of isolation leading to a ground isolation fault (250) associated therewith. The control system subsequently commands power transistor 39B for the first torque machine 30 to the SHORT state while commanding the power transistors 39A and 39C-39F for the first torque machine 30 and all the power transistors for the second torque machine 40 and all the power transistors for the accessory control module (ACM) 25 to the OPEN state. The control system monitors electric ground isolation (245) to detect loss of isolation leading to a ground isolation fault (250) associated therewith. This process is repeated until each of the power transistors 39A-39F for the first torque machine 30, each of the power transistors for the second inverter module 45 for the second torque machine 40, and each of the power transistors for the accessory control module (ACM) 25 for the accessory multiphase electric machine (AC) 60 are commanded to the SHORT state while commanding the remaining power transistors to the OPEN state and monitoring the electrical ground isolation.

The control system monitors electrical ground isolation (245) during each sequentially commanded SHORT state for each of the power transistors 39A-39F for each inverter module J (J=1 to N) of the N electric machine while commanding the power transistors to the OPEN state for all the other inverter modules of the N electric machines and monitors electric ground isolation to detect a loss of isolation leading to a ground isolation fault (245, 250, 260). The control system is able to locate a ground isolation fault relative to a specific electric machine and relative to a specific circuit associated with one of the power transistors associated with one of the inverter modules (255). Multiple locations of ground isolation faults can be detected as the control system repeats the aforementioned steps to sequentially individually command the power transistors 39A-39F for the inverter modules for the N electric machine(s) to a SHORT state (260).

Figure 4:
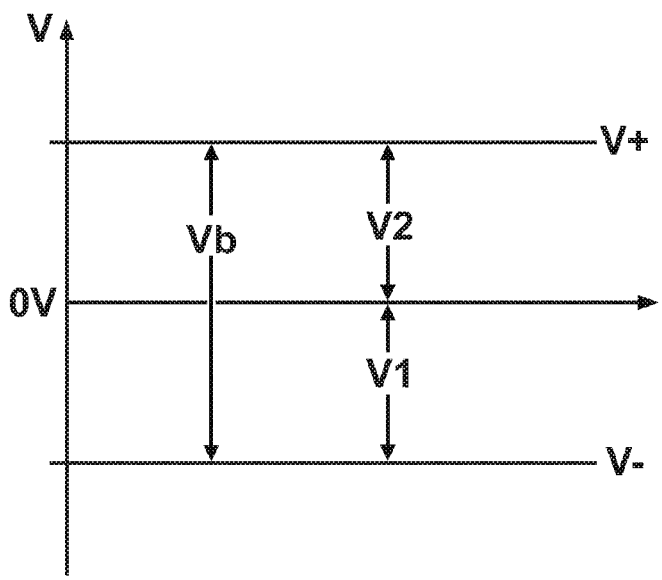
FIGS. 4 and 5 are datagraphs in accordance with the present disclosure.
Figure 5:
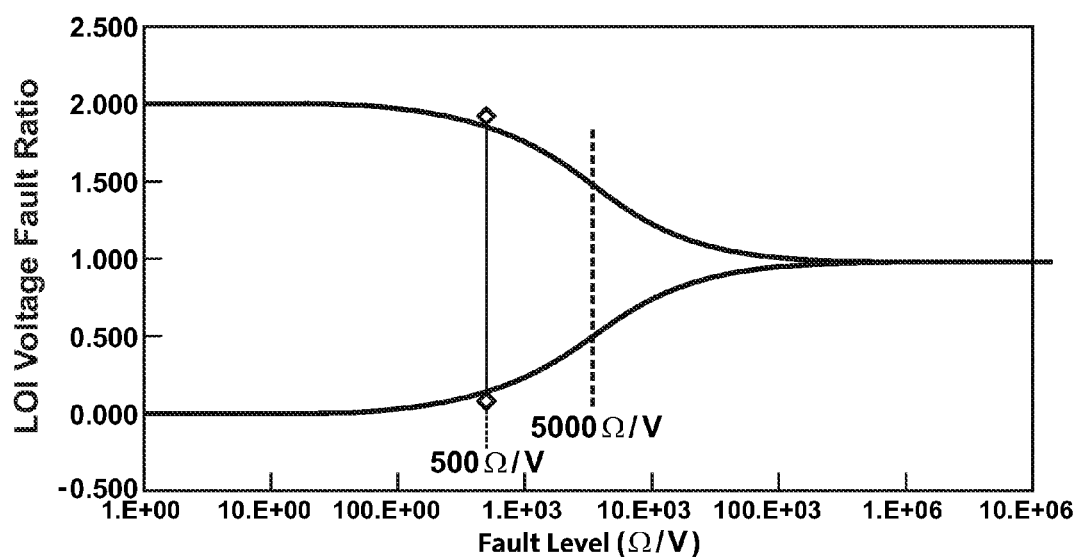

FIGS. 4 and 5 graphically show monitoring electrical ground isolation to detect a loss of isolation leading to a ground isolation fault. This includes measuring the first voltage potential V1 between the chassis ground 11 and the negative rail 54, measuring the second voltage potential V2 between the positive rail 52 and the chassis ground 11, and measuring the battery voltage Vb between the positive rail 52 and the negative rail 54 of the high voltage bus 53. In operation, the controller of the inverter module, e.g., controller 37 of inverter module 35, measures the first voltage potential V1, the second voltage potential V2, and the battery voltage Vb. The first voltage potential V1 and the second voltage potential V2 are compared to the battery voltage Vb. In one embodiment, comparing the voltage potentials V1 and V2 with the battery voltage Vb includes calculating a voltage fault ratio.

The controller 37 executes algorithmic code to calculate the voltage fault ratio, including one of the following.

$$\frac{2*V1}{Vb} \quad [1]$$

$$\frac{2*V2}{Vb} \quad [2]$$

Ideally, the voltage fault ratio calculated in either of Eqs. 1 and 2 has a value of 1.0. Allowable maximum and minimum threshold boundaries are set, including maximum and minimum threshold voltage fault ratios of 1.4 and 0.5 in one embodiment. Thus, so long as the calculated voltage fault ratio is within the maximum and minimum thresholds, there is no loss of isolation indicative of a ground isolation fault for the measured system. When the calculated voltage fault ratio is greater than the maximum threshold or less than the minimum threshold, there is a loss of isolation indicative of a ground isolation fault for the measured system that is related to a specific circuit associated with a specific one of the power transistors 39A-39F associated with a specific one of the N electric machine(s).

FIG. 5 shows loss of isolation voltage fault ratios (LOI Voltage Fault Ratio) plotted against a fault level in ohms per volt ($\Omega$/V), with maximum and minimum threshold levels. The positive and negative voltage fault ratios are calculated as described with reference to Eqs. 1 and 2, above. The determination of a fault level in ohms per volt provides an indication of a net effect of voltage, indicative of impedance between one of the positive rail 52 and the negative rail 54 of the high voltage DC bus 53 and the electrical ground 11. Thus, the maximum and minimum fault levels can indicate that the detected ground isolation fault exists in one of the positive rail 52 and the negative rail 54. For example, when a maximum isolation detection fault level of 5000 ohms per volt (5000 $\Omega$/V) is preferred, the threshold levels for voltage fault ratios are 1.4 and 0.5, as shown. For example, when a maximum isolation detection fault level of 500 ohms per volt (500 $\Omega$/V) is preferred, the threshold levels for voltage fault ratios are 1.8 and 0.2, as shown.

The embodiment of FIGS. 1 and 2 shows a system including the first and second torque machines 30 and 40 and the accessory control module (ACM) 25. It is understood that monitoring electrical isolation of an exemplary high voltage electrical system can be executed in powertrain systems employing high voltage electrical systems and multiphase electric motors, including, e.g., belt-alternator-starter systems operating at nominal 36 Vdc, range-extended electric vehicles, and series, hybrid powertrain systems having one, two, three or more electric torque machines and hybrid powertrain systems using a plurality of auxiliary and accessory power module devices.

It is understood that modifications are allowable within the scope of the disclosure. The disclosure has been described with specific reference to the preferred embodiments and modifications thereto. Further modifications and alterations may occur to others upon reading and understanding the specification. It is intended to include all such modifications and alterations insofar as they come within the scope of the disclosure.

The invention claimed is:

1. Method for monitoring operation of a vehicle including a high voltage electrical system comprising an electrical energy storage device electrically connected to a plurality of switching circuits of an inverter device via a high voltage bus, the inverter device configured to transfer electric power to an electric machine via activation of a plurality of switch devices, the method comprising:
    during ongoing vehicle operation:
        monitoring electrical ground isolation of the high voltage electrical system; and
        detecting an electrical ground isolation fault in the high voltage electrical system;
    during a vehicle key-off event subsequent to detecting the electrical ground isolation fault during ongoing vehicle operation:
        simultaneously commanding all switch devices to open states;
        monitoring electrical ground isolation of the high voltage electrical system; and
        when the electrical ground isolation fault is not detected during said simultaneous commanding of all switch devices to open states:
            iteratively commanding only one of the switch devices to a short state while simultaneously commanding every other one of the remaining switch devices to open states, wherein each iteration corresponds to a different one of the switch devices being commanded to the short state;
            monitoring electrical ground isolation of the high voltage electrical system;
            when the electrical ground isolation fault is detected during one of said iterations, associating the electrical ground isolation fault with the one of the switch devices commanded to the short state during said one of said iterations.

2. The method of claim 1, further comprising:
    during said vehicle key-off event subsequent to detecting the first occurrence of the electrical ground isolation fault:
        when a second occurrence of the electrical ground isolation fault is detected during said simultaneous commanding of all switch devices to open states associating the electrical ground isolation fault with at least one of the high voltage bus and the electrical energy storage device.

3. The method of claim 1, wherein detecting the electrical ground isolation fault comprises:
    measuring a first electrical voltage potential between a positive rail of the high voltage bus and a vehicle chassis ground;
    measuring a second electrical voltage potential between the positive rail of the high voltage bus and a negative rail of the high voltage bus; and
    detecting a difference between the first and second electrical voltage potentials.

4. Method for monitoring electrical ground isolation in a high voltage electrical system comprising an electrical energy storage device electrically connected to a plurality of switching circuits of an inverter device via a high voltage bus, the inverter device configured to transfer electric power to an electric machine for a land vehicle via activation of a plurality of switch devices, the method comprising:
    during ongoing vehicle operation:
        monitoring electrical ground isolation of the high voltage electrical system; and
        detecting an electrical ground isolation fault in the high voltage electrical system;
    detecting a vehicle key-off event; and
    subsequent to the vehicle key-off event:
        iteratively commanding only one of the switch devices to a short state while simultaneously commanding every other one of the remaining switch devices to open states, wherein each iteration corresponds to a different one of the switch devices being commanded to the short state;
        monitoring electrical ground isolation of the high voltage electrical system; and
        when the electrical ground isolation fault is detected during one of said iterations, associating the electrical ground isolation fault with the one of the switch devices commanded to the short state during said one of said iterations.

5. The method of claim 4, wherein detecting the electrical ground isolation fault in the high voltage electrical system comprises:
    measuring a first electrical voltage potential between a positive rail of the high voltage bus and a vehicle chassis ground;

measuring a second electrical voltage potential between the positive rail of the high voltage bus and a negative rail of the high voltage bus; and determining a difference between the first and second electrical voltage potentials.

* * * * *